United States Patent [19]
Werner, Jr.

[11] Patent Number: 5,323,115
[45] Date of Patent: Jun. 21, 1994

[54] ELECTROSTATIC VOLTMETER PRODUCING A LOW VOLTAGE OUTPUT

[75] Inventor: Alan J. Werner, Jr., Rochester, N.Y.

[73] Assignee: Xerox Corporation, Stamford, Conn.

[21] Appl. No.: 99,290

[22] Filed: Jul. 29, 1993

Related U.S. Application Data

[63] Continuation-in-part of Ser. No. 878,658, May 5, 1992, Pat. No. 5,270,660.

[51] Int. Cl.$^5$ .............. G01R 29/12; G01R 5/28; G01R 19/00; G01N 27/60
[52] U.S. Cl. .................. 324/457; 324/72; 324/452; 324/458
[58] Field of Search ............ 324/72, 72.5, 109, 123 R, 324/452–458

[56] References Cited

U.S. PATENT DOCUMENTS

| | | | |
|---|---|---|---|
| 3,644,828 | 2/1972 | Gathman | 324/109 X |
| 3,667,036 | 5/1972 | Seachman | 324/72 |
| 3,852,667 | 12/1974 | Williams et al. | 324/72 |
| 3,921,087 | 11/1975 | Vosteen | 330/2 |
| 4,027,240 | 5/1977 | Meade | 324/110 |
| 4,061,983 | 12/1977 | Suzuki | 330/207 P |
| 4,063,154 | 12/1977 | Andrus et al. | 324/455 |
| 4,149,119 | 4/1979 | Buchheit | 324/32 |
| 4,270,090 | 5/1981 | Williams | 324/457 |
| 4,330,749 | 5/1982 | Eda et al. | 324/457 |
| 4,673,885 | 6/1987 | Lewiner et al. | 324/452 X |
| 4,720,682 | 1/1988 | Ikushima et al. | 324/458 |
| 4,797,620 | 1/1989 | Williams | 324/458 |
| 4,804,922 | 2/1989 | Sometani et al. | 324/457 |
| 4,853,639 | 8/1989 | Vosteen et al. | 324/457 |
| 4,868,907 | 9/1989 | Folkins | 323/231 |
| 4,878,017 | 10/1989 | Williams | 324/109 |
| 4,973,910 | 11/1990 | Wilson | 324/457 |
| 5,065,102 | 11/1991 | Takanashi et al. | 324/452 |
| 5,212,451 | 5/1993 | Werner | 324/458 |

FOREIGN PATENT DOCUMENTS

| | | |
|---|---|---|
| 0274995 | 7/1988 | European Pat. Off. |
| 2450461 | 9/1980 | France |
| 62-90564 | 4/1987 | Japan |

*Primary Examiner*—Gerard R. Strecker
*Attorney, Agent, or Firm*—Duane C. Basch

[57] ABSTRACT

An electrostatic measurement apparatus for generating a modified electrical signal in proportion to an electrostatic potential present on a surface. The apparatus includes a sensor for producing a signal representative of the electrostatic potential on the surface. The apparatus also includes a high-voltage level shifter and a converter to transform the sensor signal into a low-voltage signal indicative of the surface potential. The electrostatic measurement apparatus is implemented using high-voltage and low-voltage integrated circuit technology.

43 Claims, 8 Drawing Sheets

ELECTROSTATIC VOLTMETER PRODUCING A LOW VOLTAGE OUTPUT This is a continuation-in-part of U.S. Pat. No. 5,270,660 (Ser. No. 07/878,658, filed May 5, 1992) and hereby incorporated by reference for its teachings.

This invention relates generally to the measurement of electrostatic potentials, and more particularly to an apparatus for reliably measuring an electrostatic potential.

CROSS REFERENCE

The following related applications are hereby incorporated by reference for their teachings:

"Dynamic Limiting Circuit for an Amplifier," Alan J. Werner, Jr. et al., U.S. Pat. No. 5,204,636, issued Apr. 20, 1993;

"An Integrated Linear Ultra High Voltage Device," M. Mojaradi et al., application Ser. No. 07/878,651 filed May 5, 1992; and "An Integrated Ultra Low Leakage High Voltage Protection Circuit," M. Mojaradi et al., application Ser. No. 07/878,581 filed May 5, 1992.

BACKGROUND OF THE INVENTION

The present invention is a device capable of measuring electrostatic potentials with insignificant current flow into the input of the device. Generally, such devices include a probe or sensor assembly working in conjunction with an associated voltmeter assembly which receives the signals from the probe and produces an output signal. Subsequently, the output signal may be used to drive an indicator, or to control an electrostatic process as a function of the measured electrostatic potential. Thus, the features of the present invention may be used in the printing arts and, more particularly, in an electroreprographic system to control a xerographic process. These electrostatic voltmeters, or ESVs, are particularly well suited for measuring photoreceptor surface charge, which in turn allows for the automated adjustment of machine characteristics to achieve high quality reprographic output.

Heretofore, it has been recognized that the sensing probe or electrode must be modulated, with respect to the field being measured in order to accurately measure the field. Moreover, two methods of achieving the required modulation of the electrode are known, the first requiring a stationary electrode and a vibrating element, or vane to modulate the field which reaches the electrode, as described by U.S. Pat. No. 3,921,087 to Vosteen (Issued Nov. 18, 1975), or by U.S. Pat. No. 4,149,119 to Buchheit (Issued Apr. 10, 1979). The second approach utilizes a moving electrode, affixed to the end of a vibrating element as disclosed in U.S. Pat. No. 3,852,667 to Williams et al. (Issued Dec. 3, 1974), or alternatively as disclosed in U.S. Pat. No. 5,212,451 to Werner (Issued May 18, 1993).

The ESV may also utilize an "ion probe" similar to that disclosed by Williams in U.S. Pat. No. 4,270,090 (Issued May 26, 1981) to produce a signal representative of the potential on the surface being characterized.

Moreover, numerous approaches are recognized to process the signal produced by the sensing electrode, thereby enabling the measurement of the electrostatic field potential. Some signal processing approaches are illustrated in the following disclosures which may be relevant:

U.S. Pat. No. 3,667,036
Patentee: Seachman
Issued: May 30, 1972

U.S. Pat. No. 4,027,240
Patentee: Meade
Issued: May 31, 1977

U.S. Pat. No. 4,061,983
Patentee: Suzuki
Issued: Dec. 6, 1977

U.S. Pat. No. 4,149,119
Patentee: Buchheit
Issued: April 10, 1979

U.S. Pat. No. 4,330,749
Patentee: Eda et al.
Issued: May 18, 1982

U.S. Pat. 4,853,639
Patentee: Vosteen et al.
Issued: Aug. 1, 1989

U.S. Pat. No. 4,797,620
Patentee: Williams
Issued: Jan. 10, 1989

U.S. Pat. No. 4,804,922
Patentee: Sometani et al.
Issued: Feb. 14, 1989

U.S. Pat. No. 4,868,907
Patentee: Folkins
Issued: September 19, 1989

U.S. Pat. No. 4,878,017
Patentee: Williams
Issued: Oct. 31, 1989

U.S. Pat. No. 4,973,910
Patentee: Wilson
Issued: Nov. 27, 1990

Japanese Publ. 62-90564
Inventor: Kumada
Publication Date: Apr. 25, 1987

The relevant portions of the foregoing patents may be briefly summarized as follows:

U.S. Pat. No. 3,667,036 to Seachman discloses electrometer amplifier circuits for measuring the potential of the electrostatic charge formed on an insulating surface. The circuit includes a probe assembly consisting of probe and guard electrodes. The output of the probe electrode is connected to a high impedance circuit which comprises a Metal Oxide Field Effect Transistor (MOS FET) in a source-follower configuration.

U.S. Pat. No. 4,027,240 to Meade discloses a voltmeter used in detecting an electronic voltage signal in an ordinance firing circuit, where the voltmeter is protected by a pair of back-to-back parallel-connected limiting diodes. A first limiter is used to reduce the amplitude of the detected signal, while the second limiter prevents overloading of an indicator.

U.S. Pat. No. 4,061,983 to Suzuki discloses a transistor amplifier including a bipolar transistor supplied with an input signal and a field effect transistor (FET) which is directly connected to an output electrode of the bipolar transistor to amplify the applied signal. A protective circuit senses the load impedance and activates a voltage signal which ultimately results in the lowering of the gate potential on the FET to prevent the FET from damage.

U.S. Pat. No. 4,149,119 to Buchheit teaches an electrostatic voltmeter or electrometer which includes a probe sensor for sensing electrostatic charge present on a test surface. The probe sensor is modulated using a rotating vane or shutter arrangement. The probe is also conditioned to receive both A.C. and D.C. signals which are amplified by a D.C. amplifier, where the A.C. signal from the probe is fed back to the D.C. amplifier to stabilize its output.

U.S. Pat. No. 4,330,749 to Eda et al. teaches an electrometer apparatus for measuring the electrostatic potential on the surface of a photoconductive drum. The apparatus consists of an electrode which is placed near the surface on which the electrostatic potential is to be measured. A potential proportional to the surface potential is induced in the electrode and applied to the input of an amplifier with high input impedance. The amplifier has a MOS FET input stage with a high input impedance and a low bias current.

U.S. Pat. No. 4,853,639 to Vosteen et al. discloses a non-contacting type electrometer apparatus for monitoring the electric potential of a test surface. A sensing integrator is used in conjunction with a pre-amp and a high-gain operational amplifier (opamp) to provide an improved high-frequency response.

U.S. Pat. No. 4,797,620 to Williams discloses a non-contacting electrostatic detector which eliminates the use of high-voltage circuitry in non-space dependent, high-voltage electrostatic monitoring devices. An A.C. voltage, having the same frequency as the modulator frequency, is used to produce a zero net current flow, so that the magnitude and phase of the output signal are proportional to the magnitude and polarity of the electrostatic potential monitored.

U.S. Pat. No. 4,804,922 to Sometani et al. and U.S. Pat. No. 4,868,907 to Folkins both disclose devices which proportionally convert electrostatic voltage into current.

U.S. Pat. No. 4,878,017 to Williams teaches a non-contacting electrostatic voltage follower having a response speed independent of the frequency of modulation of the capacitance or electrostatic field between a detector electrode and the measured surface. The voltage follower is capable of following both static and dynamic characteristics of an external field or potential to be measured.

U.S. Pat. No. 4,973,910 to Wilson teaches an electrostatic analyzer that incorporates a field effect transistor (FET) as a sensor used to convert electrostatic voltage into a proportional current. The sensor is described as a semiconductive device having n-p-n junctions. In operation, a zero-field reference is used to alter the base potential of the sensor, thus forming a zero-field condition. The surface potential difference is then determined as a function of the sensor base voltage, which is directly measured by a voltmeter.

The Kumada publication (JA-62-90564) illustrates a circuit for measuring surface potential, including an independent power source which provides power to an impedance converter circuit which is separated from a signal processing circuit.

The present invention includes an electrostatic voltmeter design that employs high-voltage components provided on a single integrated circuit, thereby reducing the need for discrete components in the fabrication of electrostatic voltmeters. By providing the high-voltage components on a single integrated circuit, the performance and reliability of the components are also improved. Furthermore, the high-voltage integrated circuit components may be utilized in both contacting and non-contacting electrostatic voltmeters.

In accordance with the present invention, there is provided an apparatus for generating a low voltage signal proportional to an electrostatic potential on a surface. The apparatus comprises sensing means for producing an output signal representative of the electrostatic potential on the surface; a high-voltage source adapted to produce a first potential of first polarity; high-voltage level shifting means, powered by said high-voltage source, for generating a first signal referenced to ground in response to the output signal from said sensing means; and means, connected to receive the first signal from said high-voltage level shifting means, for converting the first signal to a low voltage signal, said low voltage signal being referenced to ground potential.

In accordance with another aspect of the present invention, there is provided an apparatus for generating a low voltage electrical signal proportional to an electrostatic potential on a surface, comprising: sensing means for producing a sensor signal representative of the electrostatic potential on the surface; a high-voltage source adapted to produce a first potential having a first polarity; high-voltage level shifting means, powered by said high-voltage source, for generating a first current signal referenced to ground in response to the sensor signal; a current mirror, connected to the output of said high voltage level shifting means, for receiving the first current signal and producing a second current signal as a function of the first current signal; a second voltage source adapted to produce a second potential at a polarity opposite said first polarity, said second voltage source being adapted to drive said current mirror; and a transimpedance amplifier, connected to the output of said current mirror, for transforming the second current signal produced by said current mirror into a low voltage signal indicative of the electrostatic potential on the surface.

The present invention will be described in connection with preferred embodiments, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
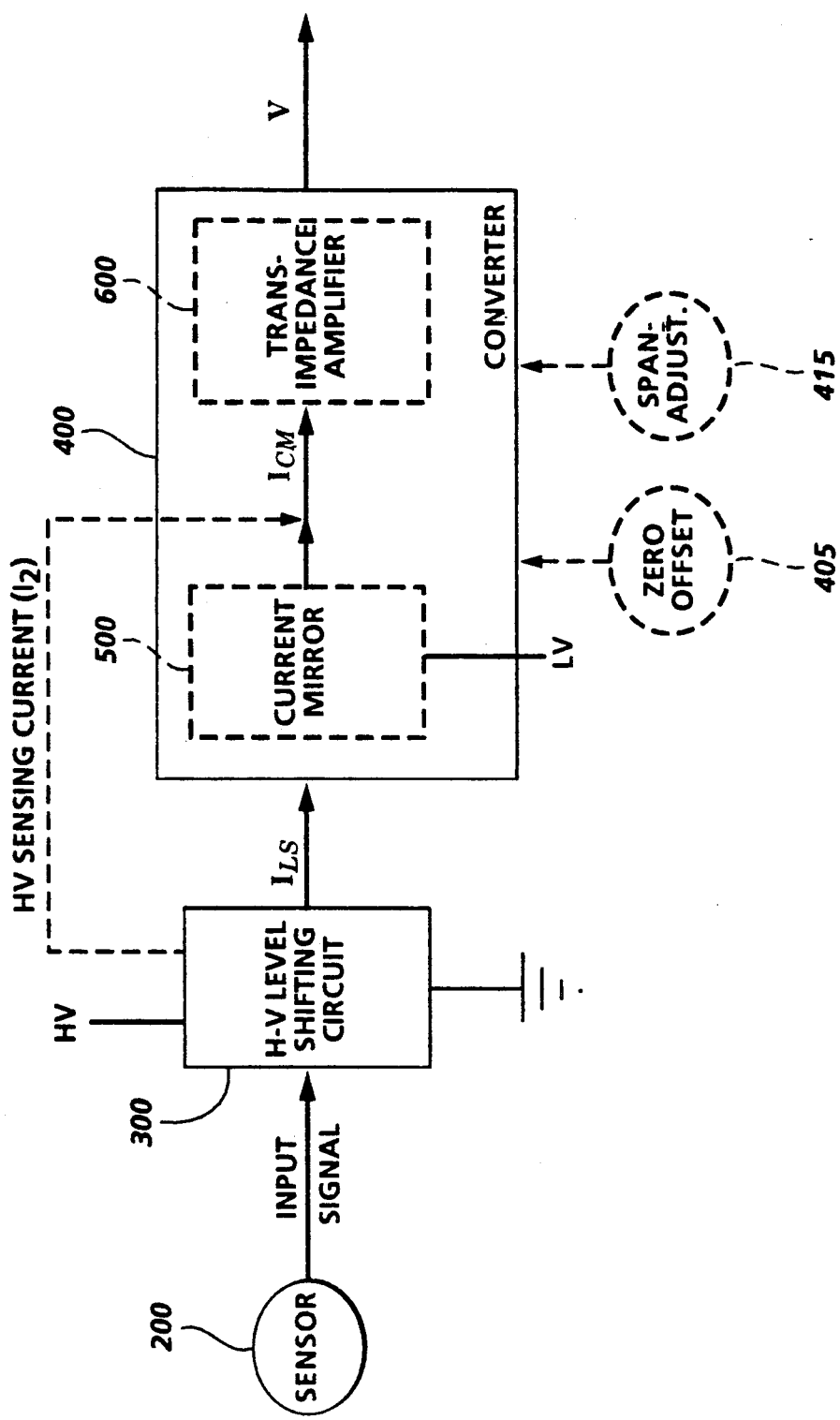
FIG. 1 is a block diagram of the elements common to each embodiment of the present invention.

For a general understanding of the electrostatic voltmeter of the present invention, reference is made to the drawings. In the drawings, like alphanumeric reference characters have been used throughout to designate identical elements. FIG. 1 is a block diagram comprising two primary elements, or blocks, which represent the improved electrostatic voltmeter. In general, the ESV generates a low voltage electrical signal, V in response to an electric signal provided by sensor 200 which is exposed to an electrostatic potential present on a surface (not shown). Depending upon the specific embodiment, the sensor may produce the input signal as a varying voltage or current signal to represent the electrostatic potential on the surface. High-voltage level shifting circuit 300 is connected to the sensor to produce a current signal, $I_{LS}$, referenced to ground potential. The magnitude of $I_{LS}$ is a measure of the surface potential. Subsequently, the current signal is passed to converter 400 to be converted to low voltage electrical signal V. As illustrated in FIG. 1, the converter includes current mirror 500, suitable for feeding the level shifted current signal into a transimpedance amplifier 600. Using a desired transfer function, the transimpedance amplifier then transforms the current signal output from the current mirror into a low voltage signal indicative of the surface potential. Converter 400 may also include two additional elements to implement the desired transfer function; zero offset circuit 405, which allows the output voltage at zero volts input to be offset from zero volts; and span-adjustment circuit 415, which adjusts the ratio between the output voltage span and input voltage span.

In the generalized block diagram depicted in FIG. 1, it is important to recognize that numerous electrical circuits and component combinations may be employed as converter 400 in order to obtain a usable output voltage V. Examples include simple means such as a single resistor, to generate a voltage indicative of the input voltage and range through standard operational amplifier techniques, to replace the relatively simple current mirror and transimpedance amplifier approach. These are well known to those skilled in the art. Having described the general elements of the improved ESV, the remaining figures will be described in detail to illustrate the specific components of high-voltage level shifting circuit 300, as well as examples of the electrical circuitry that may be used to carry out the operation of converter 400.

Figure 2:
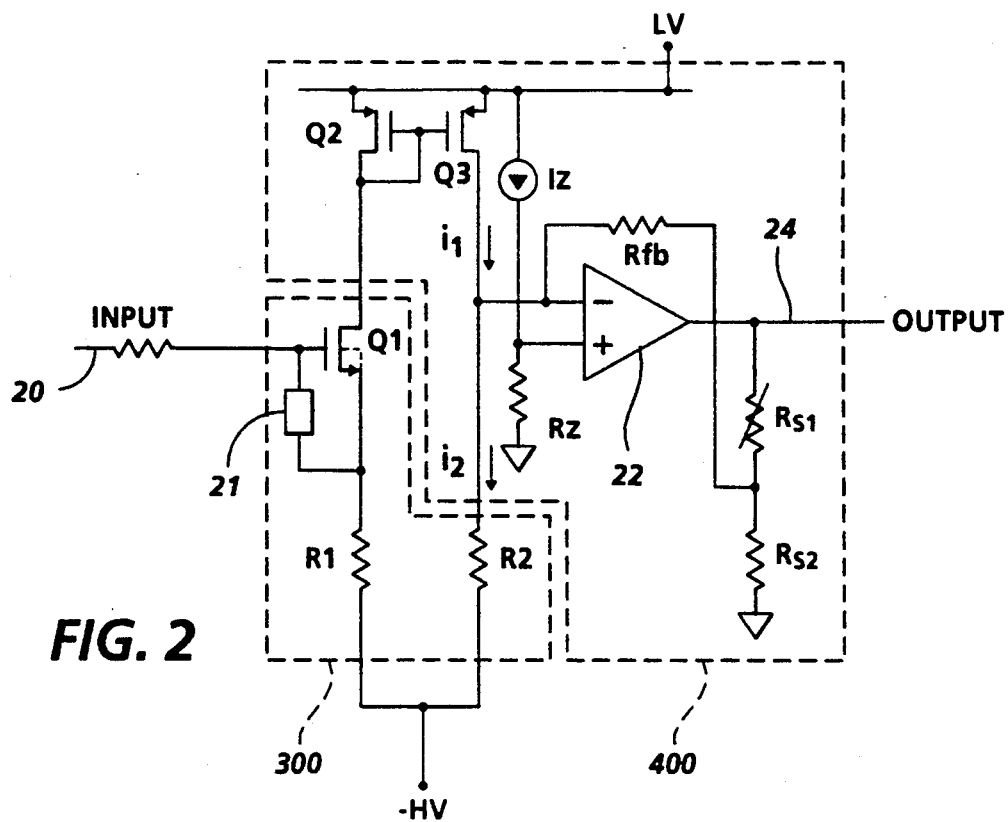
FIG. 2 is a schematic illustration of the electrical components common to each embodiment of the present invention.

FIG. 2 shows a simplified electrical circuit that is employed in both contacting and non-contacting electrostatic voltmeter embodiments. NMOS FET Q1 is a high-voltage depletion-mode NMOS driver which operates in the range of from about 0 volts to at least −1700 volts. Also included with the NMOS FET is protection device 21 which is capable of withstanding an electrostatic discharge voltage of approximately 2 KV. NMOS FET Q1 and its associated protection scheme are further described in a copending application for "An integrated Linear Ultra High Voltage Device," by Mojaradi et al., application Ser. No. 07/878,651 filed May 5, 1992, previously incorporated herein by reference. In the present embodiment, high-voltage resistors R1 and R2 are 7.69 MΩ resistors which are capable of operating over a voltage range of at least 0 to −1200 volts. Furthermore, R1 and R2 are purposefully designed to track one another over the range of ESV operating temperatures. Generally, the high-voltage resistors may be thin-film integrated circuit resistors as described in pending U.S. patent application, Ser. No. 07/513,697, by Lao et al., filed Apr. 24, 1990, the relevant portions of which are hereby incorporated by reference.

Figure 8B:
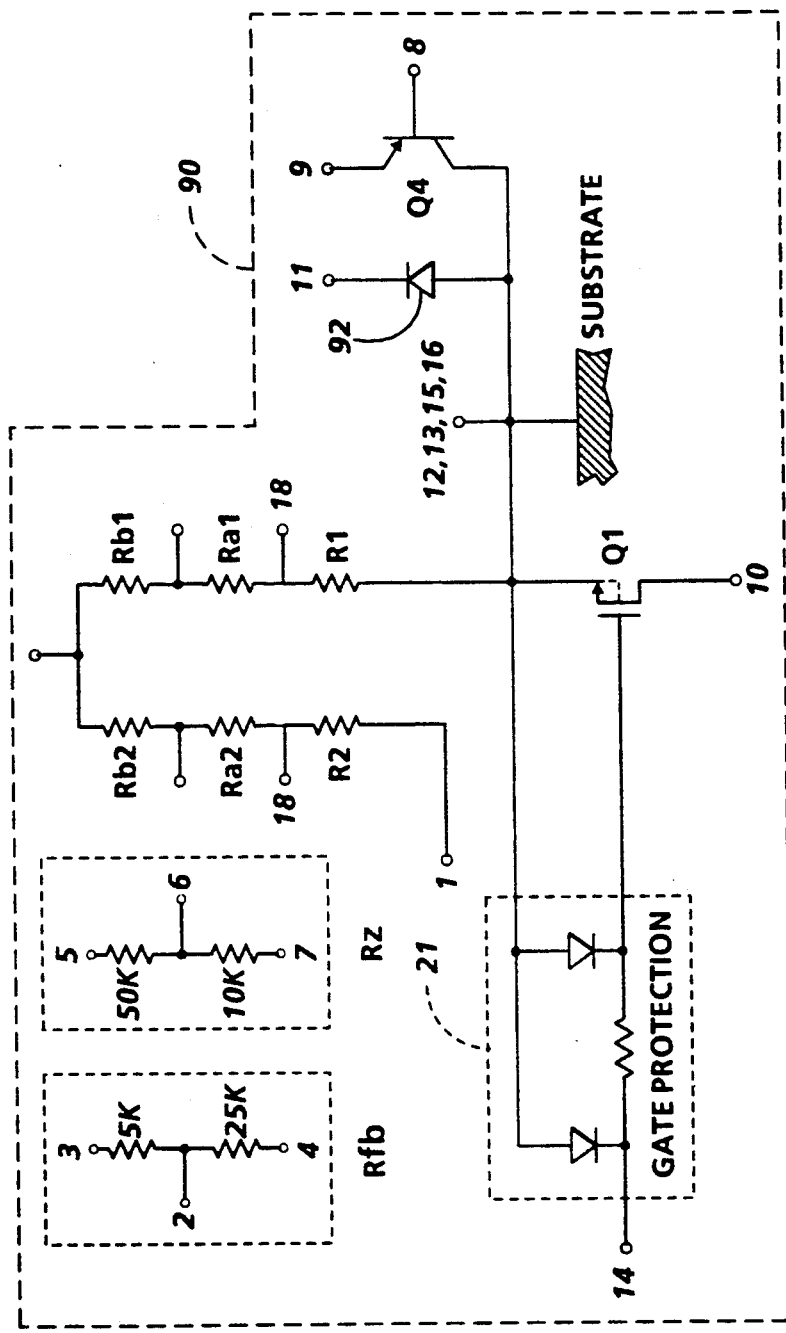
FIGS. 8A and 8B illustrate, respectively, the integrated circuit package and pin-out diagram for the high-voltage integrated circuit components of the present invention.

In operation, a high voltage in the range of about −1200 volts is detected by a sensor (not shown) and supplied to the circuit of FIG. 2 via input line 20. NMOS FET Q1, in conjunction with high-voltage resistor R1, forms a source-follower which serves as the level shifting component 300 shown in FIG. 1, where the current through the source-follower is a measure of the voltage difference between the gate of Q1 (or input voltage) and the high-voltage power supply potential, −HV. It should be noted that the embodiment depicted in FIG. 2 is a "floating" configuration, as described in the copending application by Mojaradi et. al., application Ser. No. 07/878,651 filed May 5, 1992, where the high-voltage components float with the substrate as indicated in FIG. 8B. The high-voltage power supply, depicted by −HV, may be any suitable power supply capable of providing a potential somewhat more negative than the most negative voltage being measured but within the device ratings, about −1700 volts, although the device is typically operated to measure voltages of about −1200 volts. The maximum current required from the high-voltage power supply is determined by the parallel resistance of R1 and R2 and is less than 500 μA for the typical operating range. Because the current required from the high-voltage source is low, a scorotron grid may be used as the source of the high-voltage reference potential as described by Folkins is U.S. Pat. No. 4,868,907 (Issued Sep. 19, 1989), the relevant portions of which are hereby incorporated by reference, and as shown in FIG. 9.

Figure 9:
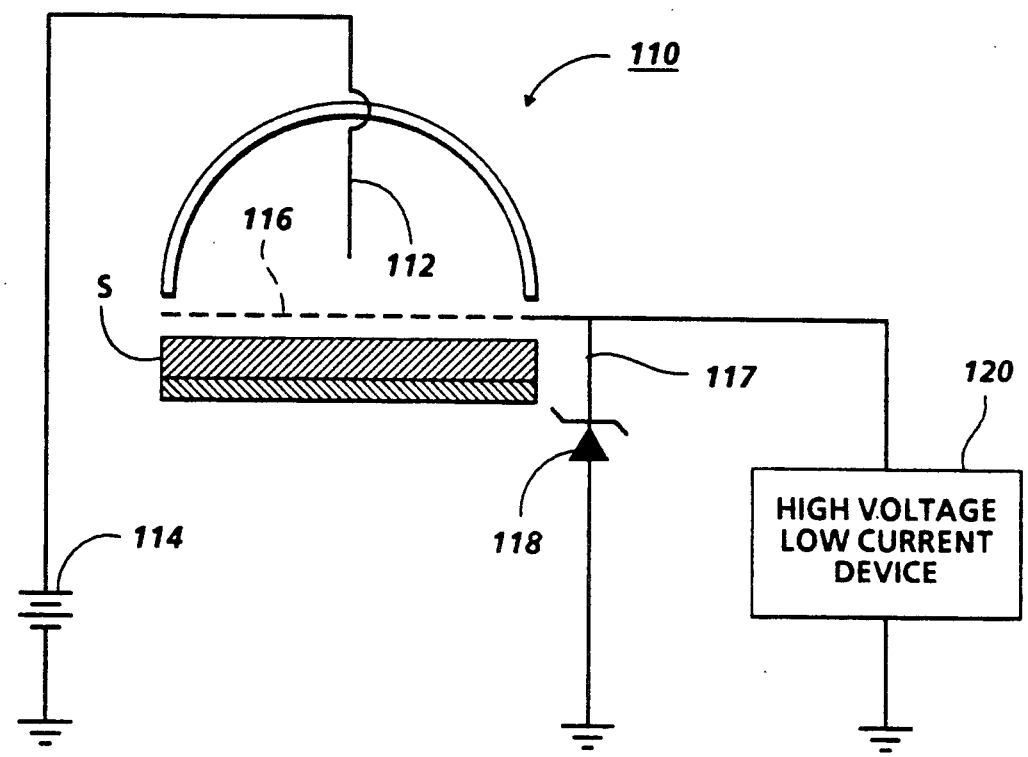
FIG. 9 is a schematic drawing demonstrating the use of a self-biased scorotron grid as a power supply for a low current, high voltage electrostatic voltmeter.

FIG. 9 illustrates the use of a corona generating device such as a self-biased scorotron grid as the power source for a low current, high voltage requirement device, preferably an electrostatic voltmeter. Accordingly, scorotron 110 for charging a photoreceptor surface S is provided with a coronode 112 such as a pin array or wire, driven to corona producing voltages with high voltage DC power supply 114. A conductive member or grid 116 is interposed between surface S and coronode 112 for the purpose of controlling the charge deposited on surface S. To maintain the desired voltage level on grid 116, which is selected to be the voltage level desired on surface S, grid 116 is connected to a ground potential via ground line 117 including a current sinking device such as Zener diode 118. The Zener diode is selected with a breakdown voltage equal to the voltage desired at the grid. Of course, various combinations of current sink devices could be used to similar effect.

In accordance with the invention, a low current, high-voltage requirement device 120, for example the electrostatic voltmeter of the present invention, may be driven from the scorotron grid by connection to ground line 117 thereof. Depending upon the voltage desired across device 120, the device may be connected to ground line 117 between any current sinking device 118 and the grid, or, with the selection of multiple current sinking devices 118, device 120 may be connected along ground line 117 between devices 118 having different voltage drops there across, to selectively obtain a desired voltage. The grid current produced by a typical pin scorotron device is about 1.5 milliamps. In an alternative embodiment, a corotron is in certain cases provided with a conductive shield which is self biased to a selected voltage. In such a case, the conductive shield may be used as the low current, high voltage source in substitution for the field. For the self biasing feature, and thus, the inventive power supply, to be operative, a substantial DC component is required.

Referring once again to FIG. 2, matched transistors Q2 and Q3 form a 1:1 current mirror, where the current from transistor Q3, $i_1$, tracks the current in transistor Q2, which in turn is the current from NMOS FET Q1. At the same time current $i_2$, in high-voltage resistor R2, is a measure of the high-voltage power supply. Therefore, the difference between the current from resistor R2 and from transistor Q3, or $i_1-i_2$, is an accurate measure of the input voltage on line 20. Since this difference current ($i_1-i_2$) is supplied by the amplifier via resistor Rfb, the output of amplifier 22 is also a measure of the input voltage. More specifically, the NMOS FET Q1 and current mirror system Q2-Q3 have translated the high voltage input to a low voltage output at ground potential while maintaining the very high input impedance required by ESVs, without any need for a low-voltage power supply floating at a voltage approximately equal to the electrostatic potential being measured.

By making the R1, R2, and Rfb resistor ratios track very tightly over the operating temperature range for the circuit, approximately 0° C. to 50° C., the voltage output by amplifier 22 on line 24 accurately and reliably traces that of the input voltage present on input line 20 over that range. The basic circuit illustrated in FIG. 2 also includes a zero circuit represented by current Iz flowing through resistor Rz, thus shifting the output range off zero. Note that as with resistor Rfb, the response of resistor Rz to temperature changes must closely track the responses of high-voltage resistors R1 and R2. A standard span adjustment circuit, including span resistors Rs1 and Rs2, is connected between the output of amplifier 22 and ground. If the material used to fabricate resistor Rfb has a temperature coefficient that is significantly different from that of the material used to fabricate resistors Rs1 and Rs2, then the span adjustment circuit requires that the parallel resistance of Rs1 and Rs2 must be much less than Rfb. In addition, it is highly desirable to fabricate R1, R2, Rz and Rfb on the same high-voltage integrated circuit. Alternatively, an external matched network of either thick or thin film resistors could be used for R1, R2, Rz and Rfb.

As another alternative, the current mirror systems described herein may be replaced by circuits comprising appropriate operation amplifiers and resistors. However, it is also important to note that such a substitution would introduce considerable complexity into the ESV circuits illustrated for each of the respective embodiments.

Figure 3:
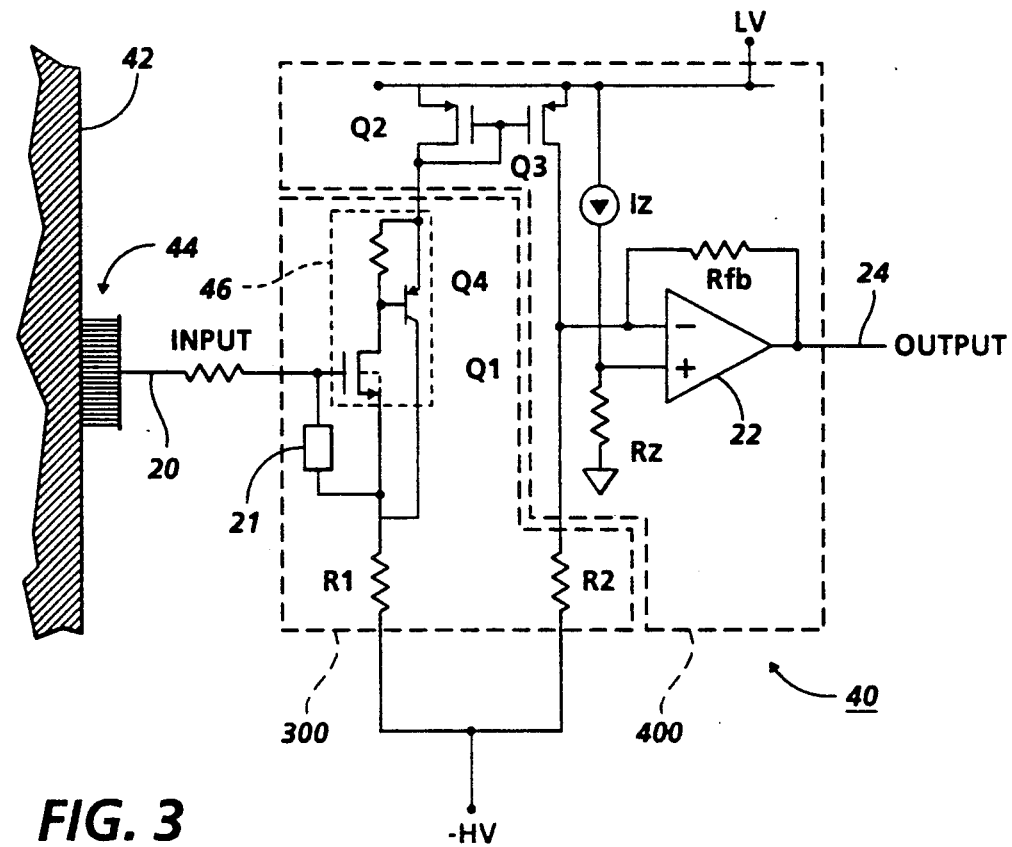
FIG. 3 is an electrical schematic showing the circuitry associated with a contacting electrostatic voltmeter embodiment of the present invention.

Referring next to FIG. 3, which shows the details of contacting electrostatic voltmeter 40, where an insulating surface 42, which may be a photoconductive member or similar member suitable for maintaining a charge thereon, is contacted by a conductive member 44. Ideally, conductive member 44 is capable of coupling with the electrostatic potential present on surface 42, without depleting the potential or redistributing any pattern of charge present thereon. In one embodiment, member 44 may be an ion probe as described by Williams in U.S. Pat. No. 4,270,090 (Issued May 26, 1981), the relevant portions of which are hereby incorporated by reference, where an ionic current flow is produced in response to the potential to be measured. In another embodiment, conductive member 44 may be a brush similar to that described in U.S. Pat. No. 5,220,481 by Swift et al., the relevant portions of which are hereby incorporated by reference. As disclosed by Swift et al. the carbon fibers within the brush, originally formed as a pultruded composite, act as a suitable path for the charge contacted by the brush on surface 42.

It should also be noted that means other than a pultrusion may be used to fabricate a suitable brush-like contact. Generally, the fibers would be combined at a common connection 20 which is the input to contacting electrostatic voltmeter 40. When the carbon fibers of the brush are insulated from one another, as disclosed by Swift et al., the effective parallel fiber contact exhibits a high electrical resistance, typically above $5 \times 10^8$ $\Omega$cm, and there is no redistribution, or smearing, of the image. However, when there is no concern for redistribution of the charge on the photoconductive surface, for example, immediately after a charging operation and before exposure, a lower resistance brush contact, without insulated fibers, may be utilized.

In addition to the contacting member, FIG. 3 also shows the addition of a high-voltage PNP transistor, Q4, which is very useful for the contacting-type ESV. Transistor Q4 is a high-voltage substrate PNP, capable of operating over a range of from about 0 volts to at least $-1250$ volts, although typically at potentials of approximately $-1200$ volts. The fabrication of a high-voltage transistor similar to Q4 is described in U.S. patent application Ser. No. 07/722,736 by Vo et al., filed Jun. 27, 1991, now abandoned. In the contacting type ESV, high voltage PNP transistor Q4 enables the compound Darlington amplifier configuration, 46, using transistors Q1 and Q4. The high common emitter current gain ($\beta \approx 100$) of Q4, effectively bootstraps the source of Q1 so that the voltage change across the gate-to-source of the high-voltage NMOS FET, Q1, is minimized, thereby minimizing the effective input capacitance of circuit 40.

Figure 4:
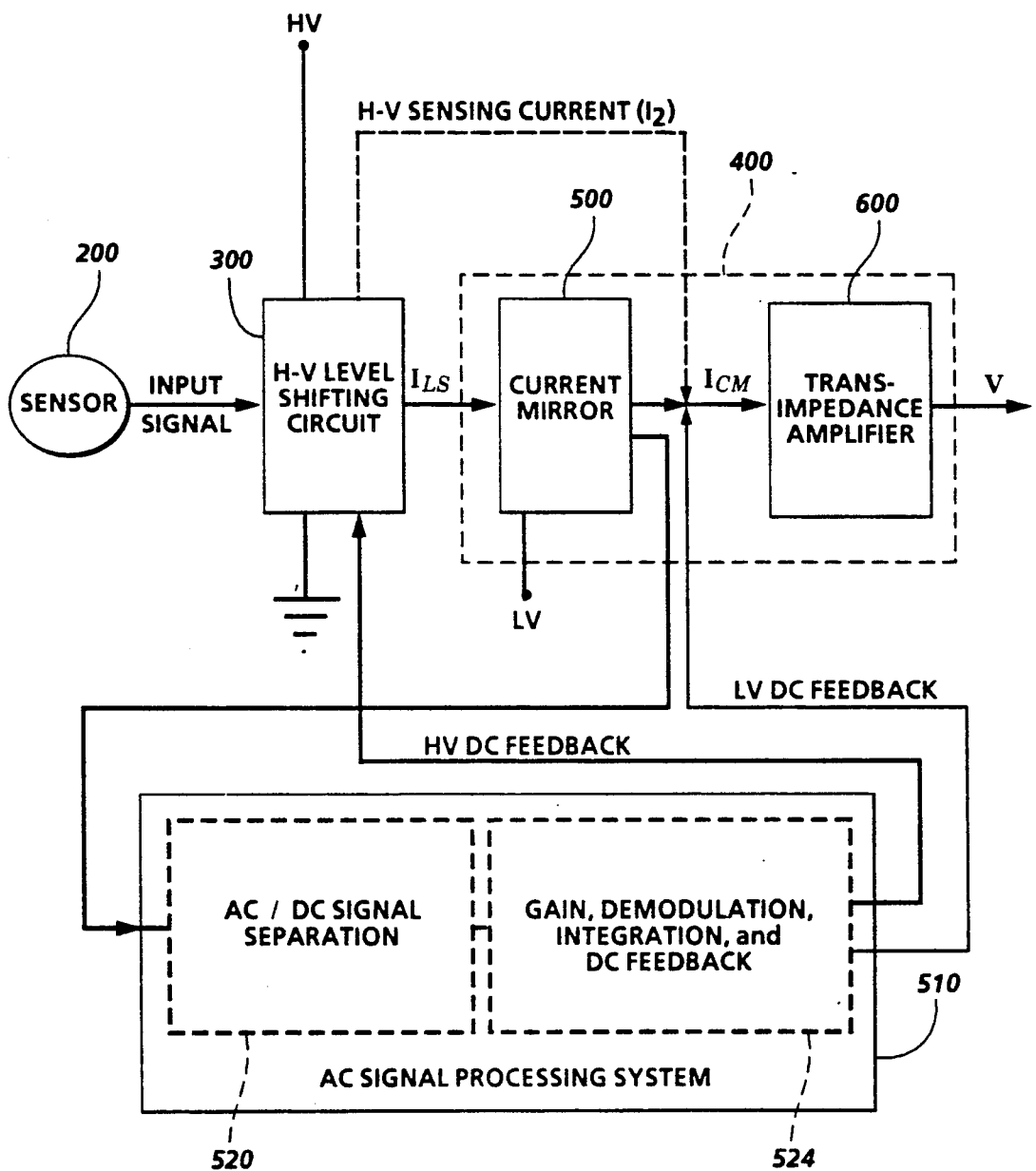
FIG. 4 is a block diagram of the elements employed in a non-contacting electrostatic voltmeter embodiment.
Figure 5:
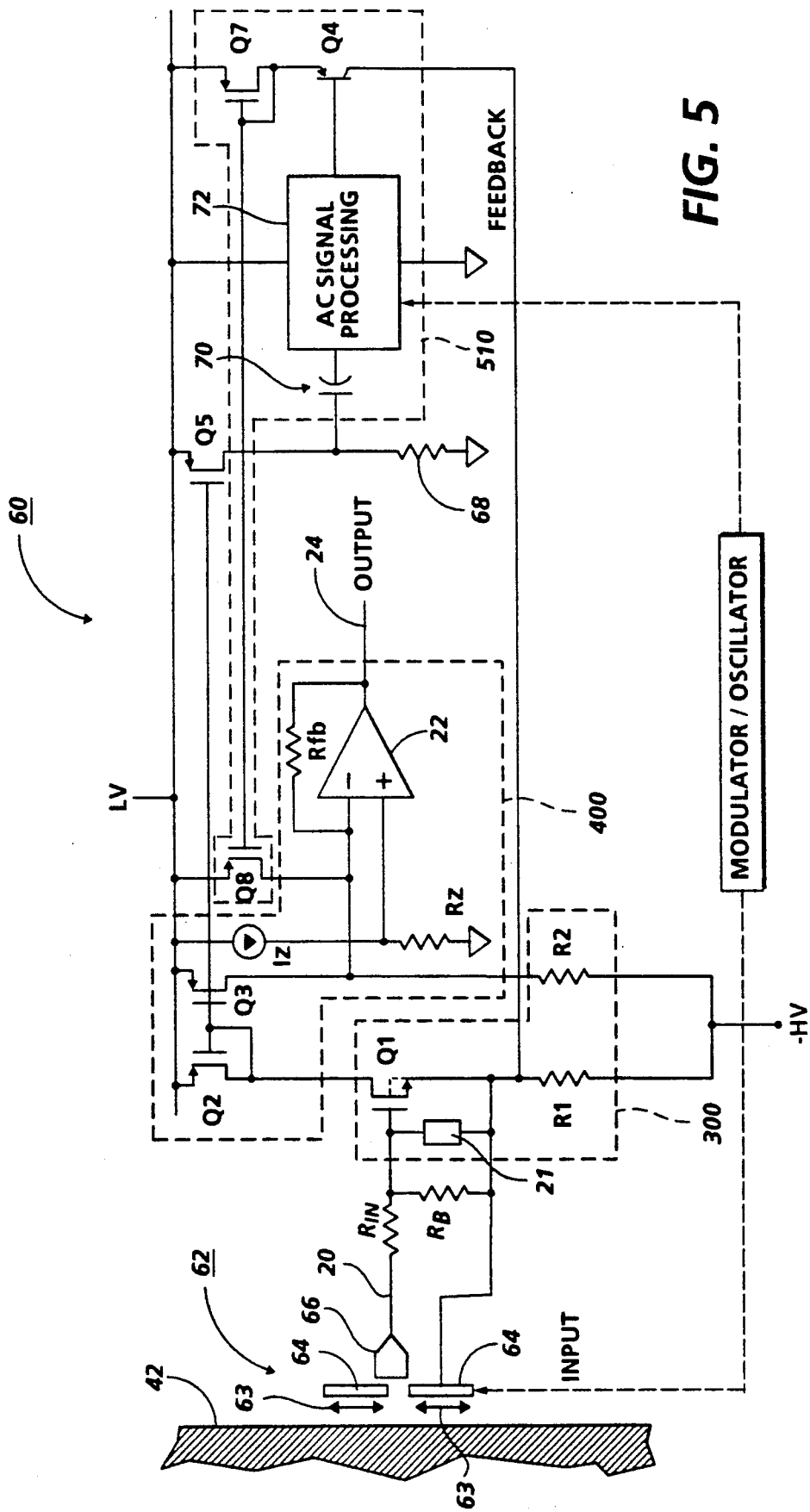
FIG. 5 is an electrical schematic showing the circuitry associated with the non-contacting electrostatic voltmeter embodiment of FIG. 4.

Referring now to FIGS. 4 and 5, which show the principal components and details of a non-contacting electrostatic voltmeter embodiment, AC signal processing element 510 has been added to the basic ESV configuration of FIG. 1. The non-contacting ESV differs significantly from the contacting ESV in that it uses a modulated signal generated as a function of the difference between the electrostatic potential on the surface and the voltage of the measuring electrode. This modulated signal is used to generate, through proper signal processing, a DC feedback signal which drives this difference to zero. This implementation of a non-contacting ESV differs significantly from previous implementations in that the high-voltage level shifting circuit (block 300) supplies both error information, via the AC modulation, and DC voltage levels, via DC signal information, at an output referenced to ground potential. This enables all signal processing to be done at ground potential.

Referring now to FIGS. 4 and 5, FIG. 4 shows two outputs from the current mirror block 500 and two outputs from the AC signal processing block 510. The current mirror output from transistor Q3 of FIG. 5 is for DC information from the input FET Q1. The current mirror output Q8 is for low-voltage DC information from the high-voltage PNP feedback transistor Q4. These two currents are therefore the same as the currents through the input FET Q1 and the feedback transistor Q4, so that their sum is the same as the current through R1. Thus, by feeding both these currents along with the current $i_2$ from resistor R2 into the transimpedance amplifier block 600, the resulting DC output is a measure of the electrostatic potential on the surface. This DC output is generated in the same manner as it is for the contacting ESV previously described by FIGS. 1, 2, and 3.

The second output from current mirror block 500 of FIG. 4 is for the AC modulation information and is specifically represented with respect to transistor Q5 of FIG. 5. Note that since this output is for purely AC information, it is not necessary to match it closely to the mirror input transistor Q2. Indeed, there are advantages to sizing the ratios of transistors Q2 and Q5 to obtain current gain and enable more desirable impedance levels via the value of load resistor 68. The AC/DC signal separation block 520 then rejects the DC component of the signal leaving the AC modulation information to be processed by the gain, demodulation, integration, and DC feedback block 524. This feedback block then generates a high-voltage feedback current for the high-voltage level shifting block 300 along with the low voltage current for the transimpedance amplifier block 600, as illustrated in FIG. 4.

More specifically, as illustrated in FIG. 5, non-contacting electrostatic voltmeter 60 includes, a modulator 62 having vanes 64, or similar sensor occluding mechanisms vibrating in the direction of arrows 63, to modulate the signal received by sensor electrode 66. In operation, modulator 62 periodically occludes the exposure of sensor electrode 66 with respect to the electrostatic field present on the surface of insulating surface 42. As is commonly known for non-contacting ESVs, the signal from sensor electrode 66 is actually generated by physically modulating the capacitive coupling between electrode 66 and surface 42, such as a photoreceptor. While one modulation method is illustrated in FIG. 4, numerous approaches are known to achieve the modulation of the capacitive coupling relationship. For example, the single-beam modulator described in U.S. Pat. No. 5,212,451 by Werner, the relevant portions of which are hereby incorporated by reference, would provide suitable modulation of the sensor electrode. This modulation causes a modulated voltage to be generated between the gate and source of the NMOS field-effect transistor Q1, or across biasing resistor $R_B$ and protection component circuit 21. The input modulation on the NMOS FET Q1 causes a modulation of its drain current which translates the modulation to ground potential (i.e., it serves as an AC signal level shifting element in block 300 of FIG. 4). For the level shifting element to function, the NMOS FET must always be on. Since the input is from a capacitively coupled modulator, DC biasing conditions from gate to source must be established. This could be accomplished by a suitable floating bias supply to establish the proper DC biasing between gate and source. However, a floating bias would be undesirable due to the need to generate a floating bias voltage supply and to "zero out" or remove the error introduced by this bias voltage. By designing the NMOS FET to be "slightly" depletion mode, that is, when $V_{gs}$ is equal to zero volts it has a small amount of current passing through it, thereby making it "active," with no DC voltage between gate and source. The need for a bias voltage is thereby eliminated and DC biasing is accomplished by a single high value resistor, $R_B$ from gate to source in parallel with the protection circuit component 21, as illustrated in FIG. 5. The modulated drain current is then fed into the current mirror via transistor Q2 of FIG. 5.

The current mirror, block 500 of FIG. 4, is represented in simplified form in FIG. 5 by the input transistor Q2 and the two output transistors, Q3 for the DC signal information and Q5 with its load resistor 68 for the AC signal modulation information. The actual implementation uses additional well known circuit refinements to enhance the performance of the current mirror depicted in FIG. 5, however, for simplicity such refinements have not been illustrated.

In a simple embodiment, the AC/DC signal separation of block 520 is accomplished using a single capacitor 70, as illustrated in FIG. 5. This approach generally works well if the drain current of the FET Q1 is quite constant with the drain to source voltage of FET Q1, that is, when the transconductance of the FET is very high. The result of a finite transconductance is a change in the DC quiescent current as the drain to source voltage is changed. A secondary, but equally important effect is due to the drain to gate capacitance ($C_{dg}$) causing a current flow through the biasing resistor $R_B$ between gate and source of the FET. This causes a transient change in the DC current as the drain to source voltage is changing, which degrades the achievable transient response of the ESV.

An alternative embodiment which significantly reduces the effect of the transient behavior of available NMOS FETs uses active operational amplifier filters and a differential operational amplifier stage for the AC/DC signal separation of block 520. This system "rejects" the DC changes by subtracting the DC and transient DC changes from the combined AC/DC signal. First, a 3-pole, active low-pass filter is used to reject substantially all of the AC signal, preferably at least about ninety percent, leaving substantially only the DC and transient DC components of the original modulated signal. The output of this filter is then subtracted from the signal on its input by using a commonly known full differential amplifier stage, thus leaving only the AC component of the modulated AC/DC signal on the output of the differential stage. The performance is enhanced by implementing the differential stage as a 2-pole active high pass filter which further rejects the low frequency transient behavior. Further enhancement is achieved by carefully selecting coupling capacitors in the gain, demodulation, integration, and DC feedback block 510. It is also possible to use commonly known passive differential networks and filters, built from appropriate resistors, capacitors, and inductors, but the performance will likely be degraded.

The gain, demodulation, and integration block 524 in FIG. 4 is implemented using well-known operational amplifier circuits. The gain stage is also enhanced by using a dynamically limited amplifier similar to that disclosed in U.S. Pat. No. 5,204,636 previously incorporated herein by reference. The DC feedback is generated by the high-voltage PNP transistor Q4 of FIG. 5 which is coupled to the output of the integration stage. The collector current of Q4 feeds the resistor R1 of the high-voltage level shifting circuit in order to supply DC feedback to drive the source/gate potential of Q1 to match the electrostatic potential on the surface. This current is also mirrored into the transimpedance amplifier of block 400 in FIG. 4 by a current mirror system represented in simplified form by transistors Q7 and Q8 so that the output voltage is accurately generated. In practice, implementation is more complex and accurate, in that it also accounts for the base current of transistor Q4 using techniques well known to those skilled in the art.

Figure 6:
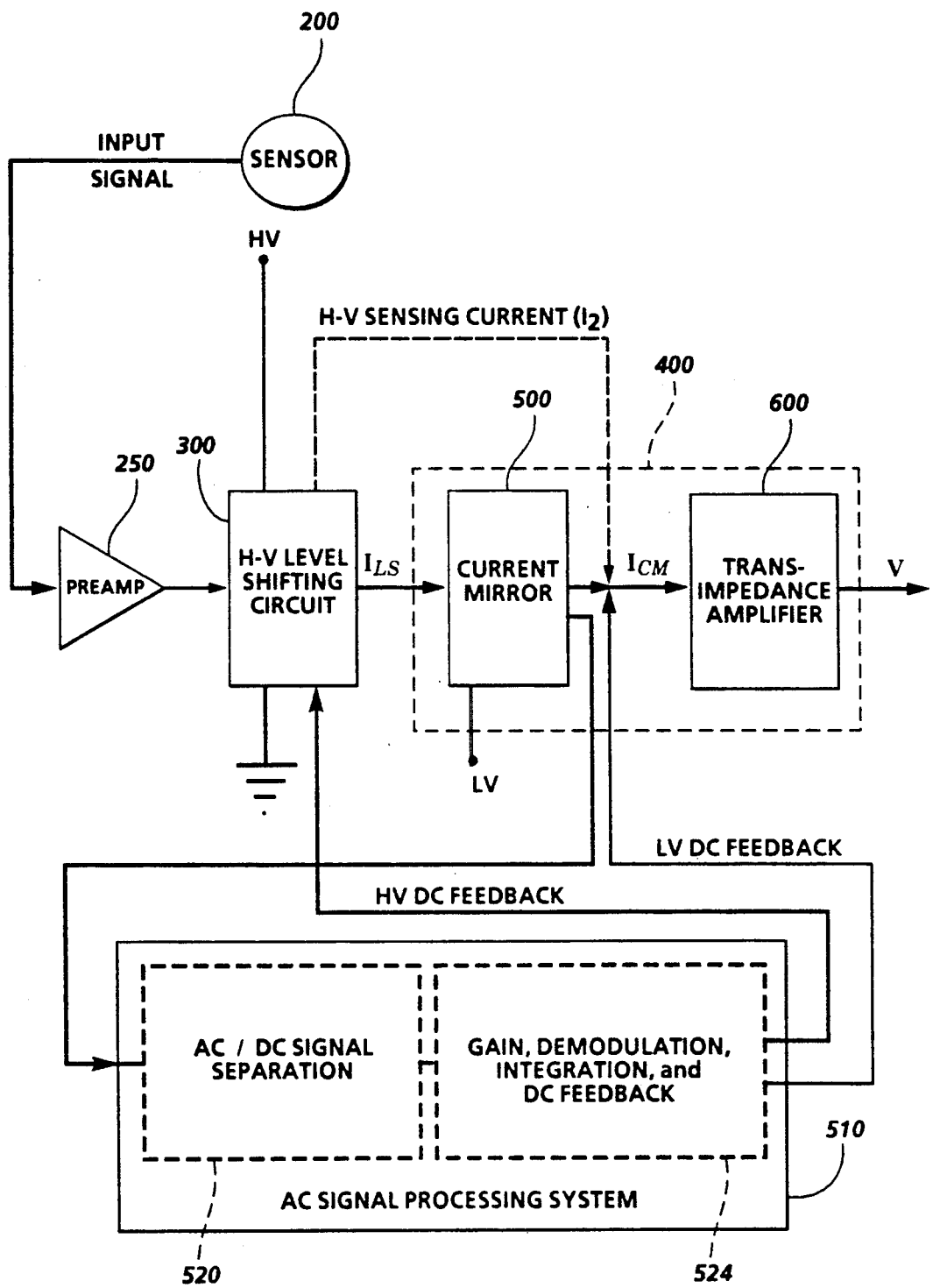
FIG. 6 is a block diagram of an alternative embodiment for the non-contacting electrostatic voltmeter illustrated in FIG. 4.

In yet another embodiment, depicted in FIG. 6, the effect of the finite transconductance of the FET is decreased by adding pre-amplifier (preamp) 250 before the H-V level shifting circuit 300, specifically between sensor 200 and the gate of FET Q1 which is present in the H-V level shifting circuit. Addition of the preamp accomplishes two things: 1) it increases the basic modulated signal (AC signal) so that the ratio of AC to DC signals is increased; and 2) it decreases the effect of drain to gate capacitance in the FET by causing the impedance seen by the FET to be the output impedance of the preamp, which is low enough such that the signal caused by the current from the FET drain to gate capacitance flowing through it becomes insignificant. Unfortunately, one detriment of adding the preamp is that it is at the potential of the FET gate/source, not at ground, and therefore must be powered from a floating power supply (not shown). However, by using a low-power operational amplifier the power required, on the order of about 0.5 mW, is much less than that which would be required if all the signal processing were accomplished at the floating potential. Therefore, in spite of the need for the floating supply to power the preamp, the embodiment remains an improvement over conventional ESVs.

While not specifically illustrated, the low-voltage components described in the contacting and non-contacting ESV embodiments, including current mirror Q2-Q3 and amplifier 22, would be provided on one low-voltage integrated circuit (IC) implemented using a 5 volt CMOS process. The low-voltage IC also has a Min/Max circuit which tracks and holds either the minimum or maximum value of the voltage measured at output 24 in the previously described embodiments. Selection of Min/Max is made via a single digital input signal, select, while resetting of the Min/Max is also via a digital signal, reset. Both digital signal inputs, select and reset, are "open collector" compatible and have internal pull-up resistors operatively associated therewith. Furthermore, both the normal "continuous" output, line 24, and the Min/Max output are buffered and are capable of driving up to 10 nF of capacitance load.

Figure 7:
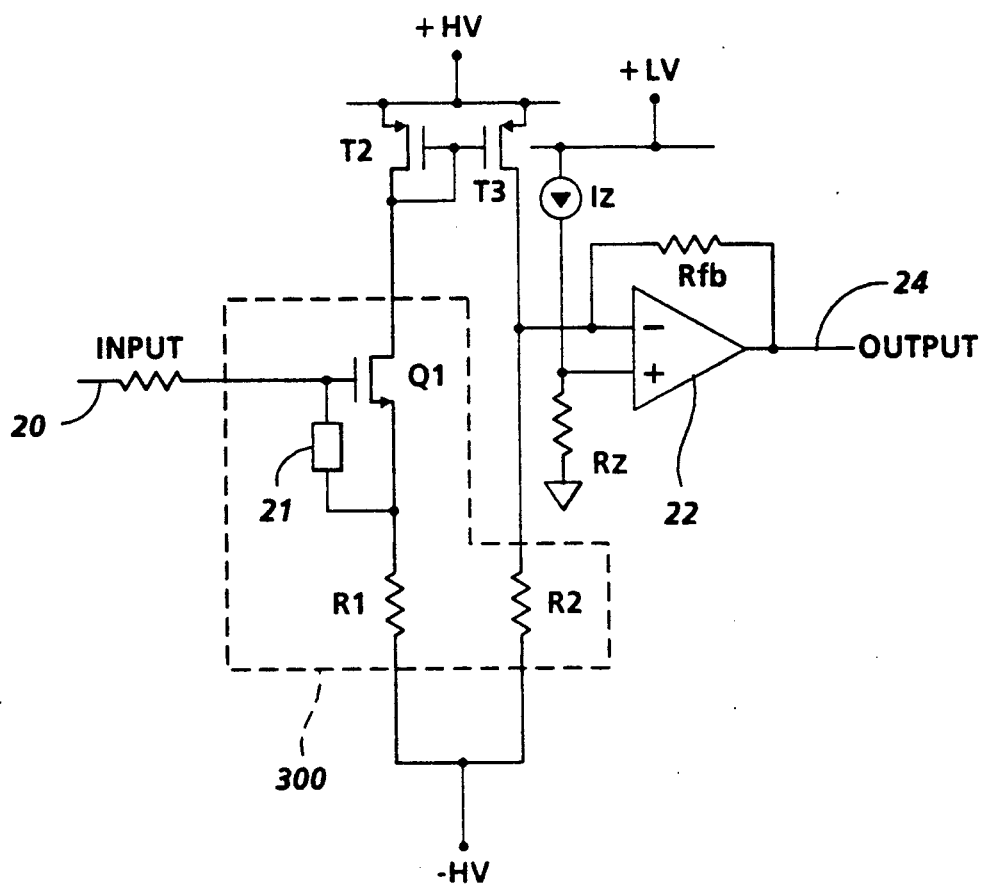
FIG. 7 is an electrical schematic illustrating an alternative embodiment of an electrostatic voltmeter circuit employing a current mirror which utilizes a high voltage PMOS FET for an output, to enable the characterization of both positive and negative input potentials.

Referring next to the schematic illustration of FIG. 7, which shows the basic components of a dual polarity electrostatic voltmeter circuit, high-voltage NMOS FET Q1 is used to interface to the input signal provided on line 20, while the current mirror comprised of PMOS FETs T2 and T3 uses high-voltage PMOS for T3 to enable it to function at a positive high voltage +HV. In an alternative embodiment, transistors T2 and T3 could replaced by bi-polar transistors with T3 now being a high voltage device to implement the function of the "high voltage" current mirror. As is commonly known, the performance of the high voltage mirror may be enhanced with the addition of low voltage devices using configurations such as the Wilson or cascode circuits with the output transistor remaining a high voltage device. The behavior of the circuit is the same as that previously described with respect to FIG. 2, where a current is produced in the second leg of the circuit, and applied to the negative input of amplifier 22, in response to the difference between the input potential and the high-voltage source. However, the present embodiment utilizes a high-voltage p-channel current mirror which can be connected to the +HV source, thus allowing the input signal to vary over almost the entire range between the two high-voltage supplies, +HV to −HV. It should be noted that all previous references to contacting and non-contacting designs are equally applicable to this configuration.

Figure 8A:
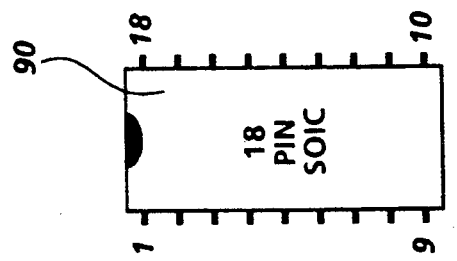

As shown in FIGS. 8A and 8B, the high-voltage components of the ESV are included on a single integrated circuit (IC), 90, containing the high-voltage NMOS FET Q1 and high voltage PNP transistor Q4. Also included on the IC are a high voltage diode, 92, which may be used in the non-contacting ESV, and the critically tracking resistors R1, R2, Rfb, and Rz. While not described in conjunction with the previous embodiments, high-voltage IC 90 also includes tapping resistor pairs Ra1, Ra2 and Rb1, Rb2, each of which have resistances of about 190Ω. The additional resistors would enable tapping at different points to modify the total resistance associated with R1 and R2.

The low-voltage IC (not shown) and high-voltage IC 90, along with supporting resistors and capacitors may be mounted on a single ceramic hybrid substrate. Power for the low-voltage components is taken from a 24 v power supply (not shown), and an internal shunt regulator on the low-voltage IC controls the low-voltage power. On the other hand, the high-voltage power may be taken from the scorotron grid power supply, as previously described with respect to FIGS. 2 and 9.

In recapitulation, the present invention is an electrostatic voltmeter circuit suitable for use in either a contacting or non-contacting, positive or negative potential sensing, type electrostatic voltmeter. The invention enables a flexible, low cost electrostatic voltmeter to be produced using a high-voltage integrated circuit in the overall design. The invention further provides a system that enables high-voltage sensing and high-voltage feedback in such a manner that signal processing is done at low voltages and at ground potential, thereby eliminating the need for "floating" low voltage power supplies which are typical of electrostatic voltmeters.

It is, therefore, apparent that there has been provided, in accordance with the present invention, an apparatus for efficiently and reliably producing a signal representative of the potential of an electrostatic field on an insulating surface. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. An apparatus for generating a low voltage signal proportional to an electrostatic potential on a surface, comprising:
    sensing means for producing an output signal representative of the electrostatic potential on the surface;
    a high-voltage source adapted to produce a first potential having a polarity the same as the electrostatic potential and a magnitude greater than that of the electrostatic potential;
    level shifting means, powered by said high-voltage source, for shifting the level of the output signal produced by said sensing means, so as to reference the output signal to a ground potential, and generating a first signal in response to the ground potential referenced output signal; and
    means, connected to receive the first signal from said level shifting means, for converting the first signal to the low voltage signal, wherein said low voltage signal is referenced to ground potential and where the magnitude of the deviation of the low voltage signal from ground potential is proportional to the electrostatic potential on the surface.

2. The apparatus of claim 1 wherein said converting means comprises:
    a current mirror, connected to an output of said level shifting means, for receiving the first current signal and producing a second current signal as a function of the first current signal;
    a second voltage source adapted to produce a second potential having a polarity opposite said first polarity, wherein said second voltage source is adapted to drive said current mirror; and
    a transimpedance amplifier, connected to an output of said current mirror, for transforming the second current signal produced by said current mirror into a low voltage signal indicative of the electrostatic potential on the surface.

3. The apparatus of claim 2, further comprising:
    means for adjusting the output of the transimpedance amplifier to match a desired transfer function which relates the electrostatic potential on the surface to the low voltage signal.

4. The apparatus of claim 3, wherein said adjusting means comprises:
    a zero offset circuit which offsets the low voltage signal from a zero volt level whenever the potential on the surface is at a zero volt level; and
    a span adjustment circuit for adjusting a span ratio, wherein the span ratio reflects the relationship between a span of the output signal and a span of the potential on the surface.

5. An apparatus for generating a low voltage electrical signal proportional to an electrostatic potential on a surface, comprising:
    sensing means for producing a sensor signal representative of the electrostatic potential on the surface;
    a high-voltage source adapted to produce a first potential having a polarity the same as the electrostatic potential and a magnitude greater than that of the electrostatic potential;
    level shifting means, powered by said high-voltage source and referenced to ground potential, for shifting the level of the sensor signal produced by said sensing means, so as to reference the sensor signal to a ground potential, and generating a first current signal in response to the level shifted sensor signal;
    a current mirror, connected to the output of said high voltage level shifting means, for receiving the first current signal and producing a second current signal as a function of the first current signal;
    a second voltage source adapted to produce a second potential at a polarity opposite said first polarity, said second voltage source being adapted to drive said current mirror; and
    a transimpedance amplifier, connected to the output of said current mirror, for transforming the second current signal produced by said current mirror into a low voltage signal indicative of the electrostatic potential on the surface.

6. The apparatus of claim 5, further comprising:
    means for adjusting the output of the transimpedance amplifier to obtain a desired transfer function which relates the electrostatic potential on the surface to the low voltage signal.

7. The apparatus of claim 5 wherein
    the second potential produced by said second voltage source has a magnitude greater than that of the electrostatic potential on the surface.

8. The apparatus of claim 5, wherein said sensing means contacts the surface.

9. The apparatus of claim 5, wherein said sensing means does not contact the surface, and wherein the signal produced by said sensing means is a modulated signal.

10. The apparatus of claim 9, further comprising:
    means for generating a second modulated output signal from the first current signal produced by said level shifting means,
    means for separating the AC component of said second modulated output signal from the AC, DC, and transient DC components thereof;
    means for converting the AC component of the second modulated output signal to a high voltage DC signal and feeding the high voltage DC signal back to said level shifting means so as to cause the input of said level shifting means to equal the electrostatic potential on the surface;
    means for generating a third current signal which is proportional to said high-voltage DC signal; and
    means for sending said third current signal to said transimpedance amplifier so that the output of said transimpedance amplifier is a sum of said second current signal and said third current signal, said sum accurately representing the electrostatic potential on the surface.

11. The apparatus of claim 10, wherein said separating means comprises a capacitor.

12. The apparatus of claim 11, wherein said separating means comprises a subtraction circuit which subtracts both the DC and transient DC components from the second modulated signal to isolate the AC component.

13. The apparatus of claim 12, wherein said subtraction circuit comprises:
    a low-pass filter which rejects substantially all of the AC component of the second modulated signal, thereby leaving the DC and transient DC components of the second modulated signal; and a differential circuit which subtracts the DC and transient DC components from the second modulated signal, thereby isolating the AC signal component thereof.

14. The apparatus of claim 13, wherein said differential circuit includes a high-pass filter.

15. The apparatus of claim 14, wherein said high-pass filter is an active circuit.

16. The apparatus of claim 13, wherein said low-pass filter is an active circuit.

17. The apparatus of claim 13, wherein said differential circuit is an active circuit.

18. The apparatus of claim 5, wherein said level shifting means comprises:
a high-voltage field-effect transistor; and
a high-voltage resistor connected between a source of said high-voltage field-effect transistor and an input of said current mirror to form a source-follower, said source-follower producing said first current signal in proportion to the difference between the electrostatic potential on the surface and the second potential.

19. The apparatus of claim 18 wherein
the second potential produced by said second voltage source has a magnitude greater than that of the electrostatic potential on the surface.

20. The apparatus of claim 18, wherein said sensing means contacts the surface.

21. The apparatus of claim 18, wherein said sensing means does not contact the surface, and wherein the signal produced by said sensing means is a modulated signal.

22. The apparatus of claim 21, further comprising:
means for generating a second modulated output signal from the first current signal produced by said level shifting means,
means for separating the AC component of said second modulated output signal from the AC, DC, and transient DC components thereof;
means for converting the AC component of the second modulated output signal to a high voltage DC signal and feeding the high voltage DC signal back to said level shifting means so as to cause the input of said level shifting means to equal the electrostatic potential on the surface;
means for generating a third current signal which is proportional to said high-voltage DC signal; and
means for sending said third current signal to said transimpedance amplifier so that the output of said transimpedance amplifier is a sum of said second current signal and said third current signal, said sum accurately representing the electrostatic potential on the surface.

23. The apparatus of claim 22, wherein said separating means comprises a capacitor.

24. The apparatus of claim 22, wherein said separating means comprises a subtraction circuit which subtracts both the DC and transient DC components from the modulated signal to isolate the AC component.

25. The apparatus of claim 24, wherein said subtraction circuit comprises:
a low-pass filter which rejects substantially all of the AC component of the second modulated signal, thereby leaving the DC and transient DC components of the second modulated signal; and
a differential circuit which subtracts the DC and transient DC components from the second modulated signal, thereby isolating the AC signal component thereof.

26. The apparatus of claim 25, wherein said differential circuit includes a high-pass filter.

27. The apparatus of claim 26, wherein said high-pass filter is an active circuit.

28. The apparatus of claim 25, wherein said low-pass filter is an active circuit.

29. The apparatus of claim 25, wherein said differential circuit is an active circuit.

30. The apparatus of claim 5, where said level shifting means comprises:
a high-voltage field-effect transistor;
a first high-voltage resistor connected between a source of said high-voltage field-effect transistor and said high-voltage source to form a source-follower, said source-follower producing said first current signal in proportion to the difference between the electrostatic potential on the surface and said first potential; and
a second high voltage resistor, connected between said high-voltage source and an input of said transimpedance amplifier, to generate a fourth current signal proportional to the first potential such that the difference between said second current signal and said fourth current signal is a representation of the electrostatic potential on the surface.

31. The apparatus of claim 30 wherein
the second potential produced by said second voltage source has a magnitude greater than that of the electrostatic potential on the surface.

32. The apparatus of claim 30, wherein said sensing means contacts the surface.

33. The apparatus of claim 30, wherein said sensing means does not contact the surface, and wherein the signal produced by said sensing means is a modulated signal.

34. The apparatus of claim 33, further comprising:
means for generating a second modulated output signal from the first current signal produced by said level shifting means,
means for separating the AC component of said second modulated output signal from the AC, DC, and transient DC components thereof;
means for converting the AC component of the second modulated output signal to a high voltage DC signal and feeding the high voltage DC signal back to said level shifting means so as to cause the input of said level shifting means to equal the electrostatic potential on the surface;
means for generating a third current signal which is proportional to said high-voltage DC signal; and
means for sending said third current signal to said transimpedance amplifier so that the output of said transimpedance amplifier is a sum of said second current signal and said third current signal, said sum accurately representing the electrostatic potential on the surface.

35. The apparatus of claim 34, wherein said separating means comprises a capacitor.

36. The apparatus of claim 34, wherein said separating means comprises a subtraction circuit which subtracts both the DC and transient DC components from the second modulated signal to isolate the AC component.

37. The apparatus of claim 36, wherein said subtraction circuit comprises:

a low-pass filter which rejects substantially all of the AC component of the second modulated signal, thereby leaving the DC and transient DC components of the second modulated signal; and a differential circuit which subtracts the DC and transient DC components from the second modulated signal, thereby isolating the AC signal component thereof.

38. The apparatus of claim 37, wherein said differential circuit includes a high pass filter.

39. The apparatus of claim 38, wherein said high-pass filter is an active circuit.

40. The apparatus of claim 37, wherein said low-pass filter is an active circuit.

41. The apparatus of claim 37, wherein said differential circuit is an active circuit.

42. The apparatus of claim 1 wherein said level shifting means is suitable for operating on an output signal having a magnitude of at least 1200 volts.

43. The apparatus of claim 5 wherein said level shifting means is suitable for operating on a sensor signal having a magnitude of at least 1200 volts.

* * * * *